US012107192B2

(12) United States Patent
Wang et al.

(10) Patent No.: US 12,107,192 B2
(45) Date of Patent: Oct. 1, 2024

(54) CONDUCTIVE THIN FILM FOR ULTRAVIOLET WAVEBAND AND PREPARATION METHOD THEREFOR

(71) Applicants: ZHONGSHAN INSTITUTE OF MODERN INDUSTRIAL TECHNOLOGY, SOUTH CHINA UNIVERSITY OF TECHNOLOGY, Guangdong (CN); SOUTH CHINA UNIVERSITY OF TECHNOLOGY, Guangdong (CN)

(72) Inventors: Hong Wang, Guangdong (CN); Rulian Wen, Guangdong (CN); Xiaolong Hu, Guangdong (CN); Quanbin Zhou, Guangdong (CN)

(73) Assignees: ZHONGSHAN INSTITUTE OF MODERN INDUSTRIAL TECHNOLOGY, SOUTH CHINA UNIVERSITY OF TECHNOLOGY, Guangdong (CN); SOUTH CHINA UNIVERSITY OF TECHNOLOGY, Guangzhou (CN)

(*) Notice: Subject to any disclaimer, the term of this patent is extended or adjusted under 35 U.S.C. 154(b) by 772 days.

(21) Appl. No.: 17/260,564

(22) PCT Filed: Sep. 17, 2019

(86) PCT No.: PCT/CN2019/106290
§ 371 (c)(1),
(2) Date: Jan. 15, 2021

(87) PCT Pub. No.: WO2020/015765
PCT Pub. Date: Jan. 23, 2020

(65) Prior Publication Data
US 2021/0305460 A1    Sep. 30, 2021

(30) Foreign Application Priority Data

Jul. 17, 2018 (CN) .......................... 201810783767.4

(51) Int. Cl.
*H01L 33/42* (2010.01)
*C23C 14/02* (2006.01)
(Continued)

(52) U.S. Cl.
CPC ............ *H01L 33/42* (2013.01); *C23C 14/025* (2013.01); *C23C 14/08* (2013.01); *C23C 14/35* (2013.01);
(Continued)

(58) Field of Classification Search
None
See application file for complete search history.

(56) References Cited

U.S. PATENT DOCUMENTS 10,629,766 B2 * 4/2020 Yuan ................ H01L 21/02565
11,018,238 B2 * 5/2021 Tsuruma ............ H01L 27/146

FOREIGN PATENT DOCUMENTS

| CN | 101661810 | 3/2010 |
| CN | 102543271 | 7/2012 |

(Continued)

OTHER PUBLICATIONS

Masahiro Orita et al., "Preparation of highly conductive, deep ultraviolet transparent β-Ga2O3 thin film at low deposition temperatures", Thin Solid Films, May 2002, pp. 134-139.
(Continued)

*Primary Examiner* — Feifei Yeung Lopez
(74) *Attorney, Agent, or Firm* — JCIP GLOBAL INC.

(57) ABSTRACT

A preparation method for a metal-doped gallium oxide transparent conductive thin film for ultraviolet waveband includes: growing a contact layer thin film (2) on a substrate
(Continued)

(1) first, and annealing the grown contact layer thin film (2) in a nitrogen-oxygen atmosphere at 400° C. to 600° C. through a rapid thermal annealing furnace; growing a first $Ga_2O_3$ thin film (31) by sputtering through magnetron sputtering under argon conditions; growing a doped thin film (4) by sputtering through magnetron sputtering under argon conditions; growing a second $Ga_2O_3$ thin film (32) by sputtering through magnetron sputtering under argon conditions; and annealing the grown thin films in a nitrogen-oxygen atmosphere at 500° C. to 600° C. through a rapid thermal annealing furnace, so that permeation, diffusion and fusion occur between thin film materials to form a metal-doped $Ga_2O_3$ thin film (5). A metal-doped gallium oxide transparent conductive thin film for ultraviolet waveband is provided.

14 Claims, 2 Drawing Sheets

(51) Int. Cl.
| | | |
|---|---|---|
| | *C23C 14/08* | (2006.01) |
| | *C23C 14/35* | (2006.01) |
| | *C23C 14/58* | (2006.01) |
| | *H01B 5/14* | (2006.01) |
| | *H01L 33/32* | (2010.01) |

(52) U.S. Cl.
CPC ........... *C23C 14/5806* (2013.01); *H01B 5/14* (2013.01); *C23C 14/024* (2013.01); *H01L 33/32* (2013.01); *H01L 2933/0016* (2013.01)

(56) References Cited

FOREIGN PATENT DOCUMENTS

| CN | 104795131 | 7/2015 |
|---|---|---|
| CN | 109136869 | 1/2019 |
| TW | 201820625 | 6/2018 |

OTHER PUBLICATIONS

Liu Jianjun et al., "Electrical and optical properties of deep ultraviolet transparent conductive Ga2O3/ITO films by magnetron sputtering", Journal of Semiconductors, Oct. 2010, pp. 1-6.

Jae-Kwan Kim et al., "Electrical and optical properties of near UV transparent conductive ITO/Ga2O3 multilayer films deposited by RF magnetron sputtering", Applied Physics Letters, Oct. 2016, pp. 1-6.

"International Search Report (Form PCT/ISA/210) of PCT/CN2019/106290," mailed on Dec. 23, 2019, with English translation thereof, pp. 1-4.

* cited by examiner ically, to a metal-doped gallium oxide transparent conductive thin film for ultraviolet waveband and a preparation method therefor. The conductive thin film is a gallium oxide transparent conductive thin film employing a metal doping technology.

CONDUCTIVE THIN FILM FOR ULTRAVIOLET WAVEBAND AND PREPARATION METHOD THEREFOR

CROSS-REFERENCE TO RELATED APPLICATION

This application is a 371 of international application of PCT application serial no. PCT/CN2019/106290, filed on Sep. 17, 2019, which claims the priority benefit of China application no. 201810783767.4, filed on Jul. 17, 2018. The entirety of each of the above mentioned patent applications is hereby incorporated by reference herein and made a part of this specification.

BACKGROUND

Technical Field

The present invention relates to a conductive thin film with a high transmittance in an ultraviolet waveband, and more particularly, to a metal-doped gallium oxide transparent conductive thin film for ultraviolet waveband and a preparation method therefor. The conductive thin film is a gallium oxide transparent conductive thin film employing a metal doping technology.

Description of Related Art

It is very important to prepare a transparent conductive thin film with a low contact resistance and a high optical transmittance during preparation of optoelectronic devices to form a good ohmic contact with an epitaxial wafer and reduce absorption of an emission light source. ITO has a band gap ranging from 3.5 eV to 4.3 eV. There are mature processes in preparation of a blue LED and a green LED, but there is serious light absorption in an ultraviolet waveband. The thicker the thin film is, the more the absorbed ultraviolet light is. Therefore, it is of far-reaching significance to find a thin film capable of replacing the ITO as a transparent conductive layer in the ultraviolet waveband. As a wide band material, $Ga_2O_3$ has a band gap of 4.9 eV to 5.0 eV, which has attracted wide attention because a large-size and high-quality wafer thereof may be manufactured through a single crystal synthesized by a melt growth method. Ga2O3 has been studied in a metal-semiconductor field effect transistor, a metal-oxide-semiconductor field effect transistor, and a Schottky barrier diode. Moreover, people also think of using Ga2O3 in preparation of an ultraviolet LED due to a high transmittance thereof in the ultraviolet waveband.

However, since $Ga_2O_3$ is a semiconductor material with a wide band gap, a conductivity thereof is very poor. People improve the conductivity thereof by doping In or Sn to form $\mu$-$Ga_2O_3$. Orita M, Hiramatsu H et al. (Orita M, Hiramatsu H, OhtaH, et al. Preparation of highly conductive, deep ultraviolet transparent $\mu$-$Ga_2O_3$ thin film at low deposition temperatures [J]. Thin Solid Films. 2002, 411(1):134-139) prepared a polycrystalline $\mu$-$Ga_2O_3$ thin film on silicon glass at 880° C., so that a conductivity of about 1 S/cm was obtained, and a maximum conductivity of 8.2 S/cm (about $1.22 \times 104$ Ω/sq) was obtained by preparing a (201)-oriented Sn-doped $\mu$-Ga2O3 thin film, but the technology was still difficult to be used in preparation of a LED conductive thin film. Liu J J et al. (Liu J J, Yan J 1, Shi L, e t al. Electrical and optical properties of deep ultraviolet transparent conductive $Ga_2O_3$/ITO films by magnetron sputtering [J]. Journal of semiconductors. 2010, 31(10):5-9.) improved a square resistance and a transmittance of the $Ga_2O_3$/ITO thin film by adjusting a growth temperature, a thickness of the ITO, and other conditions, and the square resistance of 323 Ω/sq and the transmittance of 77.6% were implemented at 280 nm. Jae-kwan Kim et al. (Kim J, Lee J. Electrical and optical properties of near UV transparent conductive ITO/$Ga_2O_3$ multilayer films deposited by RF magnetron sputtering [J]. Applied Physics Letters. 2016, 109(17):172107.) implemented the transmittance of 80.94% and the square resistance of 58.6 Ω/sq at 380 nm. The Kie Young Woo team in Korea prepared an Ag/$Ga_2O_3$ model, and improved the contact characteristic and the conductivity of the thin film by an Ag insertion layer, so that the transmittance of 91% and a specific contact resistivity of $3.06 \times 10^{-2}$ Ωcm$^2$ were implemented at 380 nm. However, the transmittance of the $Ga_2O_3$ thin film prepared by the above method in the prior art is still not high enough in an ultraviolet waveband with a wavelength lower than 390 nm, and the thin film itself has a large square resistance and a poor conductivity.

SUMMARY

Technical Problems

Solutions of Problems

Technical Solutions

In order to overcome the defects of a poor contact characteristic and a low conductivity of a $Ga_2O_3$ thin film in an ultraviolet waveband, the present invention provides a novel metal-doped gallium oxide transparent conductive thin film and a preparation method therefor, so that a square resistance of the thin film is reduced and a contact characteristic with an epitaxial material is improved while a transmittance thereof in the ultraviolet waveband is improved. The square resistance of the thin film is lower than 20 Ω/sq, and the transmittance of the thin film is greater than 90% in an ultraviolet waveband above 330 nm.

The technical solutions used in the present invention to solve the technical problems are as follows.

A preparation method for a metal-doped gallium oxide transparent conductive thin film for ultraviolet waveband includes the following steps:

1) growing a contact layer thin film on a substrate using an electron beam evaporation conventionally, and annealing the grown contact layer thin film in a nitrogen-oxygen atmosphere at 400° C. to 600° C. through a rapid thermal annealing furnace;

2) growing a first $Ga_2O_3$ thin film by sputtering through magnetron sputtering under argon conditions, and controlling a thickness of the first $Ga_2O_3$ thin film to be 10 nm to 20 nm;

3) growing a doped thin film by sputtering through magnetron sputtering under argon conditions, the doped thin film being an Ag, Al or Ti thin film, and controlling a thickness of the doped thin film to be 3 nm to 7 nm;

4) growing a second $Ga_2O_3$ thin film by sputtering through magnetron sputtering under argon conditions, and controlling a thickness of the second $Ga_2O_3$ thin film to be 10 nm to 20 nm; and 5) annealing the grown thin films in a nitrogen-oxygen atmosphere at 500° C. to 600° C. through a rapid thermal annealing furnace, so that permeation, diffusion, and fusion occur between thin film materials to form a metal-doped $Ga_2O_3$ thin film.

In order to further achieve the objective of the present invention, preferably, the substrate in the step 1) is obtained by washing respectively with sulfuric acid, hydrogen peroxide, and ammonia water in a water bath at 60° C.

Preferably, the substrate in the step 1) is circular, with a thickness of 1 mm to 2 mm. The substrate is a GaN-based LED epitaxy.

Preferably, the contact layer thin film in the step 1) is made of ITO or Ni. If the contact layer thin film is made of the ITO, the ITO has a growth thickness of 10 nm to 20 nm. If the contact layer thin film is made of the Ni, the Ni has a growth thickness of 1 nm to 4 nm.

Preferably, the magnetron sputtering in the step 2) has a power of 120 W to 140 W, a substrate rotation speed of 20 rmp, and a pressure of 5 mtorr; and the sputtering lasts for 5 minutes to 10 minutes.

Preferably, the magnetron sputtering in the step 3) has a power of 100 W to 120 W, a substrate rotation speed of 20 rmp, and a pressure of 5 mtorr.

Preferably, the magnetron sputtering in the step 4) has a power of 120 W to 140 W, a substrate rotation speed of 20 rmp, and a pressure of 5 mtorr; and the sputtering lasts for 5 minutes to 10 minutes.

Preferably, the metal-doped Ga2O3 thin film in the step 5) is formed by fusing the contact layer thin film, the first Ga2O3 thin film, the doped thin film, and the second Ga2O3 thin film; and the metal-doped Ga2O3 thin film has a thickness of 24 nm to 67 nm.

Preferably, the annealing in both the step 1) and the step 5) lasts for 1 minute to 5 minutes.

A metal-doped gallium oxide transparent conductive thin film for ultraviolet waveband is prepared by the above preparation method, the metal-doped gallium oxide transparent conductive thin film has a square resistance lower than 20 Ω/sq, and a transmittance higher than 90% in an ultraviolet waveband above 330 nm.

Beneficial Effects of Invention

Beneficial Effects

Compared with the prior art, the present invention has the following advantages and beneficial effects.

1) The transmittance of the thin film of the present invention is improved in the ultraviolet waveband, the square resistance of the thin film is reduced at the same time, the square resistance of the metal-doped gallium oxide transparent conductive thin film is lower than 20 Ω/sq, and the transmittance of the thin film in the ultraviolet waveband above 330 nm is greater than 90%.

2) According to the present invention, a contact layer thin film is inserted below the $Ga_2O_3$ thin film, and a contact performance between the $Ga_2O_3$ thin film and the epitaxial material can be improved.

3) Elements in the thin film of the present invention are diffused, infiltrated, and fused after high-temperature annealing, and contents of elements in the contact layer thin film and oxygen element obtained by an XPS test are increased.

4) A contact characteristic between the thin film of the present invention and a μ-GaN surface reaches a specific contact resistivity of $10^{-3}$ Ωcm².

5) According to the preparation method of the present invention, a contact layer thin film is grown first, then after high-temperature annealing, the first $Ga_2O_3$ thin film, the metal-doped thin film, and the second $Ga_2O_3$ thin film are grown, and then are formed together through high-temperature annealing, so that the preparation method is simple.

6) According to the present invention, conventional magnetron sputtering device and electron beam evaporation device are used to deposit each thin film, and new device does not need to be introduced into the original device, so that a process difficulty will not be increased, with an obvious cost advantage.

BRIEF DESCRIPTION OF THE DRAWINGS

Description of the Drawings

Figure 1:
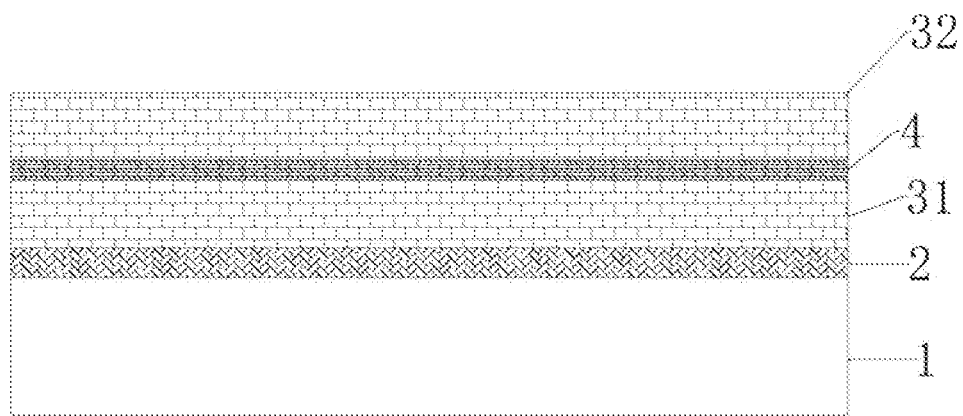

FIG. 1 is a schematic cross-sectional view of a transparent conductive thin film before annealing in Embodiment 1.

Figure 2:
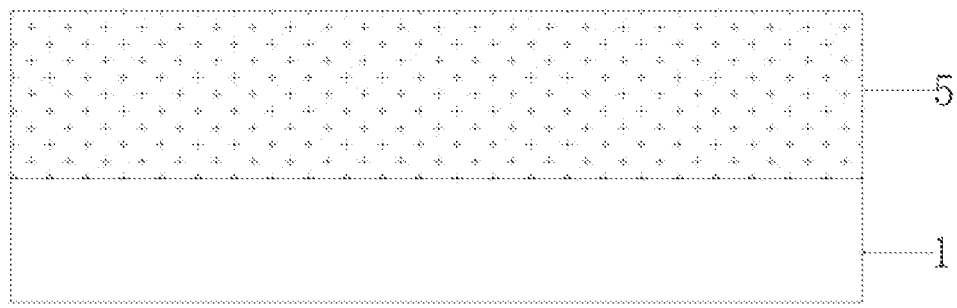

FIG. 2 is a schematic cross-sectional view of a $Ga_2O_3$ transparent conductive thin film for ultraviolet waveband after annealing in Embodiment 1.

Figure 3:
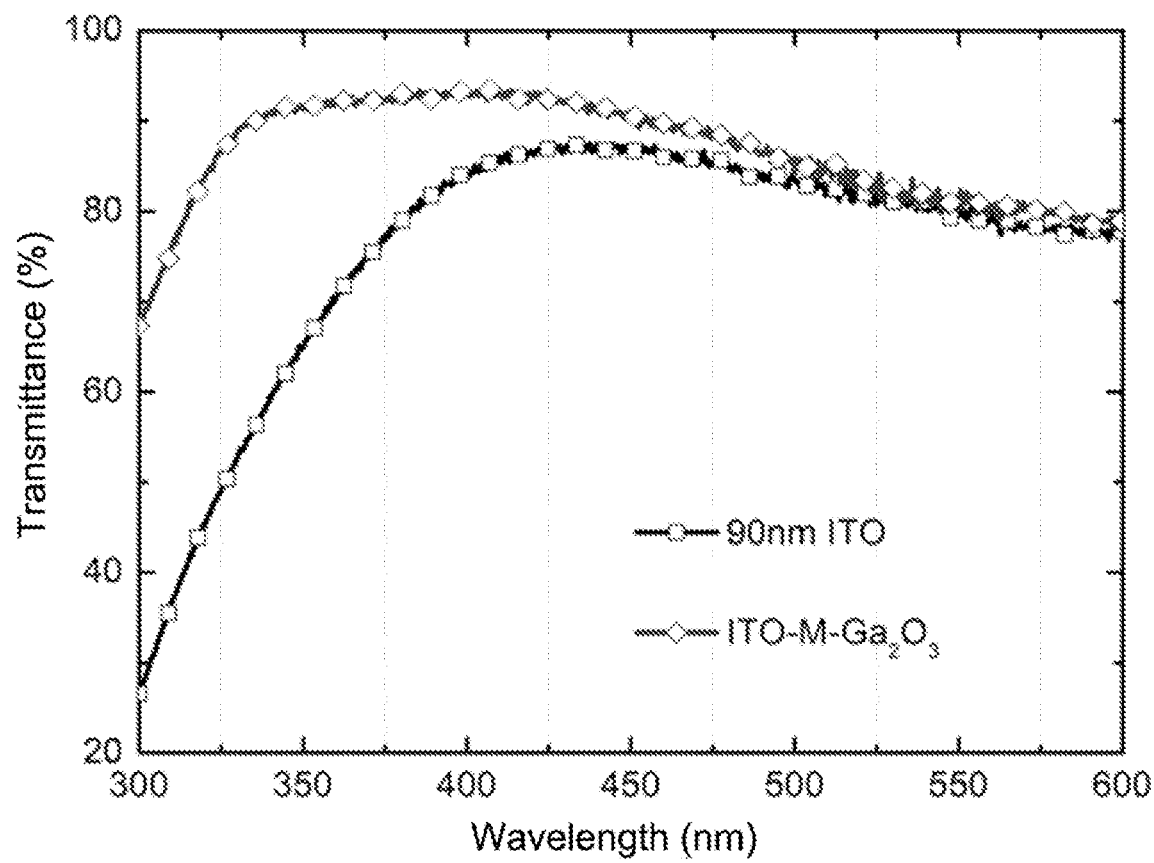

FIG. 3 is a curve graph of transmittances of the $Ga_2O_3$ transparent conductive thin film for ultraviolet waveband in Embodiment l and an ordinary 90 nm ITO thin film.

In the drawings, 1 refers to substrate, 2 refers to contact layer thin film, 31 refers to first $Ga_2O_3$ thin film, 4 refers to doped thin film, 32 refers to second $Ga_2O_3$ thin film, and 5 refers to metal-doped $Ga_2O_3$ thin film.

DESCRIPTION OF THE EMBODIMENTS

Implementations of the Present Invention

In order to better understand the present invention, the present invention is further described hereinafter with reference to the accompanying drawings and the embodiments, but the implementations of the present invention are not limited hereto.

Embodiment 1

FIG. 1 is a schematic cross-sectional view of a novel metal-doped $Ga_2O_3$ thin film before high-temperature annealing in a specific embodiment.

As shown in FIG. 1, a preparation method for a metal-doped gallium oxide transparent conductive thin film for ultraviolet waveband included the following steps:

1) a contact layer thin film 2 was conventionally grown on a substrate 1 respectively washed with sulfuric acid, hydrogen peroxide, and ammonia water in a water bath at 60° C. using an electron beam evaporation first, the contact layer thin film 2 was ITO, with a thickness of 10 nm, and was annealed in a nitrogen-oxygen atmosphere at 600° C. for 1 minute through a rapid thermal annealing furnace;

2) a first $Ga_2O_3$ thin film 31 was grown by sputtering through magnetron sputtering with a power of 140 W, a substrate rotation speed of 20 rmp, and a pressure of 5 mtorr under argon conditions, the sputtering preferably lasted for 10 minutes, and a thickness of the first $Ga_2O_3$ thin film was 15 nm;

3) a doped thin film 4 was grown by sputtering through magnetron sputtering with a power of 100 W, a substrate rotation speed of 20 rmp, and a pressure of 5 mtorr under argon conditions, and the doped thin film 4 was an Ag thin film with a thickness of 7 nm;

4) a second $Ga_2O_3$ thin film 32 was grown by sputtering through magnetron sputtering with a power of 140 W, a substrate rotation speed of 20 rmp, and a pressure of 5 mtorr under argon conditions, the sputtering preferably lasted for 10 minutes, and a thickness of the second Ga$_2$O$_3$ thin film was 15 nm; and 5) the grown thin films were integrally annealed in a nitrogen-oxygen atmosphere at 600° C. for 1 minute through a rapid thermal annealing furnace, and a metal-doped Ga$_2$O$_3$ thin film 5 shown in FIG. 2 was formed by infiltration, diffusion, and fusion between thin film materials. Specifically, the contact layer thin film 2, the first Ga$_2$O$_3$ thin film 31, the doped thin film 4, and the second Ga$_2$O$_3$ thin film 32 were fused into the metal-doped Ga$_2$O$_3$ thin film 5. The metal-doped Ga$_2$O$_3$ thin film 5 had a thickness of 47 nm.

A transmittance of the sample in Embodiment 1 was measured with an ellipsometer to obtain a curve graph of the transmittance in FIG. 3. In FIG. 3, an x-coordinate is the wavelength, and a y-coordinate is the transmittance. The 90 nm ITO is an ITO thin film with a thickness of 90 nm, which is formed by conventional electron beam evaporation and deposition, and an ITO-Ga$_2$O$_3$—Ag—Ga$_2$O$_3$ thin film is the sample prepared in Embodiment 1. It can be seen from FIG. 3 that the transmittance of the sample in the embodiment is much higher than that of the conventional 90 nm ITO thin film in a waveband range of 300 nm to 500 nm.

Table 1 shows transmittance and square resistance parameters of the new metal-doped Ga$_2$O$_3$ thin film 5 with the ITO as the contact layer thin film 2 and the 90 nm ITO thin film at 365 nm in Embodiment 1, and the square resistance is measured with a four-probe tester. The square resistance of the novel metal-doped Ga$_2$O$_3$ thin film 5 in the embodiment is much lower than that of the conventional 90 nm ITO thin film.

TABLE 1

| 365 nm | 90 nm ITO | ITO-M-Ga$_2$O$_3$ |
|---|---|---|
| Transmittance | 78.03% | 92.68% |
| Square resistance | 45.03 Ω/sq | 20.1 Ω/sq |

The square resistance of the ultraviolet waveband Ga$_2$O$_3$ transparent conductive thin film of the present invention is reduced to 20 Ω/sq, the transmittance at a waveband of 365 nm is over 92%, and the specific contact resistivity between the thin film and the μ-GaN surface is $10^{-3}$ Ωcm$^2$. Since the ITO is used as the contact layer, and the doped thin film 4 is added, an overall ohmic contact characteristic of the thin film is improved. Meanwhile, due to a high transmittance of the Ga$_2$O$_3$ thin film in the ultraviolet waveband, the overall high transmittance of the thin film is ensured.

Compared with an ITO transparent conductive thin film, the transparent conductive thin film of the present invention has a higher thin film optical transmittance and a lower thin film square resistance. According to the present invention, conventional magnetron sputtering device and electron beam evaporation device are used to deposit each thin film, and new device does not need to be introduced into the original device, so that a process difficulty will not be increased.

The Ga$_2$O$_3$ transparent conductive thin film for ultraviolet waveband of the present invention combines the contact layer thin film with a better conductivity and the Ga$_2$O$_3$ thin film with a higher transmittance, which is beneficial for improving the transmittance of the thin film in the ultraviolet waveband and reducing the square resistance by overcoming problems of a poor contact characteristic and a low conductivity of an existing Ga$_2$O$_3$ thin film in the ultraviolet waveband.

Embodiment 2

A preparation method for a metal-doped gallium oxide transparent conductive thin film for ultraviolet waveband included the following steps:

1) a contact layer thin film 2 was conventionally grown on a substrate 1 respectively washed with sulfuric acid, hydrogen peroxide, and ammonia water in a water bath at 60° C. using an electron beam first, the contact layer thin film 2 was Ni, with a thickness of 4 nm, and was annealed in a nitrogen-oxygen atmosphere at 600° C. for 1 minute through a rapid thermal annealing furnace;

2) a first Ga$_2$O$_3$ thin film 31 was grown by sputtering through magnetron sputtering with a power of 140 W, a substrate rotation speed of 20 rmp, and a pressure of 5 mtorr under argon conditions, the sputtering preferably lasted for 10 minutes, and a thickness of the first Ga$_2$O$_3$ thin film was 15 nm;

3) a doped thin film 4 was grown by sputtering through magnetron sputtering with a power of 100 W, a substrate rotation speed of 20 rmp, and a pressure of 5 mtorr under argon conditions, and the doped thin film 4 was an Ag thin film with a thickness of 7 nm;

4) a second Ga$_2$O$_3$ thin film 32 was grown by sputtering through magnetron sputtering with a power of 140 W, a substrate rotation speed of 20 rmp, and a pressure of 5 mtorr under argon conditions, the sputtering preferably lasted for 10 minutes, and a thickness of the second Ga$_2$O$_3$ thin film was 15 nm; and 5) the grown thin films were integrally annealed in a nitrogen-oxygen atmosphere at 600° C. for 1 minute through a rapid thermal annealing furnace, and a metal-doped Ga$_2$O$_3$ thin film 5 shown in FIG. 2 was formed by infiltration, diffusion, and fusion between thin film materials. Specifically, the contact layer thin film 2, the first Ga$_2$O$_3$ thin film 31, the doped thin film 4, and the second Ga$_2$O$_3$ thin film 32 were fused into the metal-doped Ga$_2$O$_3$ thin film 5. The metal-doped Ga$_2$O$_3$ thin film 5 had a thickness of 41 nm.

The square resistance of the ultraviolet waveband Ga$_2$O$_3$ transparent conductive thin film in Embodiment 2 is reduced to 16 Ω/sq, the transmittance at a waveband of 365 nm is over 93%, and the contact characteristic between the thin film and the μ-GaN surface is $0.5 \times 10^{-3}$ Ωcm$^2$.

Embodiment 3

A preparation method for a metal-doped gallium oxide transparent conductive thin film for ultraviolet waveband included the following steps:

1) a contact layer thin film 2 was conventionally grown on a substrate 1 respectively washed with sulfuric acid, hydrogen peroxide, and ammonia water in a water bath at 60° C. using an electron beam first, the contact layer thin film 2 was ITO, with a thickness of 10 nm, and was annealed in a nitrogen-oxygen atmosphere at 600° C. for 1 minute through a rapid thermal annealing furnace;

2) a first Ga$_2$O$_3$ thin film 31 was grown by sputtering through magnetron sputtering with a power of 140 W, a substrate rotation speed of 20 rmp, and a pressure of 5 mtorr under argon conditions, the sputtering preferably lasted for 10 minutes, and a thickness of the first Ga$_2$O$_3$ thin film was 10 nm;

3) a doped thin film 4 was grown by sputtering through magnetron sputtering with a power of 100 W, a substrate rotation speed of 20 rmp, and a pressure of 5 mtorr under argon conditions, and the doped thin film 4 was an Ag thin film with a thickness of 7 nm;

4) a second $Ga_2O_3$ thin film 32 was grown by sputtering through magnetron sputtering with a power of 140 W, a substrate rotation speed of 20 rmp, and a pressure of 5 mtorr under argon conditions, the sputtering preferably lasted for 10 minutes, and a thickness of the second $Ga_2O_3$ thin film was 10 nm; and 5) the grown thin films were integrally annealed in a nitrogen-oxygen atmosphere at 600° C. for 1 minute through a rapid thermal annealing furnace, and a metal-doped $Ga_2O_3$ thin film 5 shown in FIG. 2 was formed by infiltration, diffusion, and fusion between thin film materials. Specifically, the contact layer thin film 2, the first $Ga_2O_3$ thin film 31, the doped thin film 4, and the second $Ga_2O_3$ thin film 32 were fused into the metal-doped $Ga_2O_3$ thin film 5. The metal-doped $Ga_2O_3$ thin film 5 had a thickness of 37 nm.

The square resistance of the ultraviolet waveband $Ga_2O_3$ transparent conductive thin film in Embodiment 2 is reduced to 20 Ω/sq, the transmittance at a waveband of 365 nm is over 94%, and the contact characteristic between the thin film and the μ-GaN surface is $10^{-3}$ Ωcm².

It should be noted that the embodiments do not constitute any restrictions on the present invention. Apparently, after understanding the contents and principles of the present invention, those skilled in the art can make various modifications and changes in forms and details without departing from the principles and scope of the present invention. These modifications and changes based on the present invention are still within the scope of protection claimed by the present invention.

What is claimed is:

1. A preparation method for a metal-doped gallium oxide transparent conductive thin film for ultraviolet waveband, wherein the preparation method comprises the following steps:
  1) growing a contact layer thin film on a substrate using an electron beam conventionally, and annealing the grown contact layer thin film in a nitrogen-oxygen atmosphere at 400° C. to 600° C. through a rapid thermal annealing furnace; wherein the contact layer thin film is made of ITO or Ni, and if the contact layer thin film is made of the ITO, the ITO has a growth thickness of 10 nm to 20 nm; and if the contact layer thin film is made of the Ni, the Ni has a growth thickness of 1 nm to 4 nm;
  2) growing a first $Ga_2O_3$ thin film by sputtering through magnetron sputtering under argon conditions, and controlling a thickness of the first $Ga_2O_3$ thin film to be 10 nm to 20 nm; wherein the contact layer thin film is disposed between the first $Ga_2O_3$ thin film and the substrate;
  3) growing a doped thin film by sputtering through magnetron sputtering under argon conditions, the doped thin film being an Ag, Al or Ti thin film, and controlling a thickness of the doped thin film to be 3 nm to 7 nm;
  4) growing a second $Ga_2O_3$ thin film by sputtering through magnetron sputtering under argon conditions, and controlling a thickness of the second $Ga_2O_3$ thin film to be 10 nm to 20 nm; and
  5) annealing the grown thin films integrally in a nitrogen-oxygen atmosphere at 500° C. to 600° C. through the rapid thermal annealing furnace, so that permeation, diffusion and fusion occur between thin film materials to form a metal-doped $Ga_2O_3$ thin film, wherein the metal-doped $Ga_2O_3$ thin film in the step 5) is formed by fusing the contact layer thin film, the first $Ga_2O_3$ thin film, the doped thin film, and the second $Ga_2O_3$ thin film; and the metal-doped $Ga_2O_3$ thin film has a thickness of 24 nm to 67 nm.

2. The preparation method for the metal-doped gallium oxide transparent conductive thin film for ultraviolet waveband according to claim 1, wherein the substrate in the step 1) is obtained by washing respectively with sulfuric acid, hydrogen peroxide, and ammonia water in a water bath at 60° C.

3. The preparation method for the metal-doped gallium oxide transparent conductive thin film for ultraviolet waveband according to claim 1, wherein the substrate in the step 1) is circular, with a thickness of 1 mm to 2 mm; and the substrate is a GaN-based LED epitaxy.

4. The preparation method for the metal-doped gallium oxide transparent conductive thin film for ultraviolet waveband according to claim 1, wherein the magnetron sputtering in the step 2) has a power of 120 W to 140 W, a substrate rotation speed of 20 rmp, and a pressure of 5 mtorr; and the sputtering lasts for 5 minutes to 10 minutes.

5. The preparation method for the metal-doped gallium oxide transparent conductive thin film for ultraviolet waveband according to claim 1, wherein the magnetron sputtering in the step 3) has a power of 100 W to 120 W, a substrate rotation speed of 20 rmp, and a pressure of 5 mtorr.

6. The preparation method for the metal-doped gallium oxide transparent conductive thin film for ultraviolet waveband according to claim 1, wherein the magnetron sputtering in the step 4) has a power of 120 W to 140 W, a substrate rotation speed of 20 rmp, and a pressure of 5 mtorr; and the sputtering lasts for 5 minutes to 10 minutes.

7. The preparation method for the metal-doped gallium oxide transparent conductive thin film for ultraviolet waveband according to claim 1, wherein the annealing in both the step 1) and the step 5) lasts for 1 minute to 5 minutes.

8. A metal-doped gallium oxide transparent conductive thin film for ultraviolet waveband, wherein the ultraviolet waveband metal-doped gallium oxide transparent conductive thin film is prepared by the preparation method according to claim 1; and the metal-doped gallium oxide transparent conductive thin film has a square resistance lower than 20 Ω/sq, and a transmittance higher than 90% in an ultraviolet waveband above 330 nm.

9. A metal-doped gallium oxide transparent conductive thin film for ultraviolet waveband, wherein the ultraviolet waveband metal-doped gallium oxide transparent conductive thin film is prepared by the preparation method according to claim 2; and the metal-doped gallium oxide transparent conductive thin film has a square resistance lower than 20 Ω/sq, and a transmittance higher than 90% in an ultraviolet waveband above 330 nm.

10. A metal-doped gallium oxide transparent conductive thin film for ultraviolet waveband, wherein the ultraviolet waveband metal-doped gallium oxide transparent conductive thin film is prepared by the preparation method according to claim 3; and the metal-doped gallium oxide transparent conductive thin film has a square resistance lower than 20 Ω/sq, and a transmittance higher than 90% in an ultraviolet waveband above 330 nm.

11. A metal-doped gallium oxide transparent conductive thin film for ultraviolet waveband, wherein the ultraviolet waveband metal-doped gallium oxide transparent conductive thin film is prepared by the preparation method according to claim 4, and the metal-doped gallium oxide transparent conductive thin film has a square resistance lower than 20 Ω/sq, and a transmittance higher than 90% in an ultraviolet waveband above 330 nm.

12. A metal-doped gallium oxide transparent conductive thin film for ultraviolet waveband, wherein the ultraviolet waveband metal-doped gallium oxide transparent conductive thin film is prepared by the preparation method according to claim 5; and the metal-doped gallium oxide transparent conductive thin film has a square resistance lower than 20 Ω/sq, and a transmittance higher than 90% in an ultraviolet waveband above 330 nm.

13. A metal-doped gallium oxide transparent conductive thin film for ultraviolet waveband, wherein the ultraviolet waveband metal-doped gallium oxide transparent conductive thin film is prepared by the preparation method according to claim 6; and the metal-doped gallium oxide transparent conductive thin film has a square resistance lower than 20 Ω/sq, and a transmittance higher than 90% in an ultraviolet waveband above 330 nm.

14. A metal-doped gallium oxide transparent conductive thin film for ultraviolet waveband, wherein the ultraviolet waveband metal-doped gallium oxide transparent conductive thin film is prepared by the preparation method according to claim 7; and the metal-doped gallium oxide transparent conductive thin film has a square resistance lower than 20 Ω/sq, and a transmittance higher than 90% in an ultraviolet waveband above 330 nm.

* * * * *